(12) United States Patent
Juarez et al.

(10) Patent No.: US 7,700,155 B1
(45) Date of Patent: Apr. 20, 2010

(54) METHOD AND APPARATUS FOR MODULATION OF PRECURSOR EXPOSURE DURING A PULSED DEPOSITION PROCESS

(75) Inventors: Francisco Juarez, Fremont, CA (US);
Dennis Hausmann, Los Gatos, CA (US); Bunsen Nie, Fremont, CA (US);
Teresa Pong, Dublin, CA (US);
Adrianne Tipton, Pleasanton, CA (US);
Patrick Van Cleemput, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 1092 days.

(21) Appl. No.: 10/821,092

(22) Filed: Apr. 8, 2004

(51) Int. Cl.
*C23C 16/00* (2006.01)
(52) U.S. Cl. .................. 427/248.1; 427/255.7
(58) Field of Classification Search ............. 427/255.28
See application file for complete search history.

(56) References Cited

U.S. PATENT DOCUMENTS

| | | | | |
|---|---|---|---|---|
| 5,213,650 A | * | 5/1993 | Wang et al. ............. 156/345.54 |
| 5,268,034 A | * | 12/1993 | Vukelic ....................... 118/719 |
| 5,728,425 A | * | 3/1998 | Ebe et al. ................... 427/248.1 |
| 6,716,287 B1 | * | 4/2004 | Santiago et al. ............. 118/729 |
| 2001/0002280 A1 | * | 5/2001 | Sneh ....................... 427/255.28 |
| 2003/0031807 A1 | * | 2/2003 | Elers et al. ................... 427/569 |
| 2003/0059535 A1 | * | 3/2003 | Luo et al. ............... 427/255.28 |
| 2003/0185977 A1 | * | 10/2003 | Kalynushkin et al. ..... 427/248.1 |

* cited by examiner

*Primary Examiner*—Michael Cleveland
*Assistant Examiner*—Michael G Miller
(74) *Attorney, Agent, or Firm*—DeLio & Peterson, LLC; Peter W. Peterson

(57) ABSTRACT

A method of depositing material on a substrate comprises providing a reactor with a reaction chamber having a first volume, and contacting a surface of a substrate in the reaction chamber with a first precursor at the first chamber volume to react with and deposit a first layer on the substrate. The method further includes enlarging the reaction chamber to a second, larger volume and removing undeposited first precursor and any excess reaction product to end reaction of the first precursor with the substrate.

19 Claims, 4 Drawing Sheets

METHOD AND APPARATUS FOR MODULATION OF PRECURSOR EXPOSURE DURING A PULSED DEPOSITION PROCESS

BACKGROUND OF INVENTION

1. Field of the Invention

The present invention relates to reactors used in the semiconductor manufacturing industry and, in particular, to a reactor for pulsed layer deposition of thin films in the fabrication of integrated circuits.

2. Description of Related Art

A primary goal of the semiconductor manufacturing industry is to reduce the size of integrated circuits in order to them to perform more operations in a shorter time. As integrated circuit device features become smaller, several technical difficulties are presented. One such problem is depositing conformal thin films in holes or trenches having a small diameter or a small width-to-depth ratio. One standard technique for depositing such thin films has been chemical vapor deposition (CVD), which works well for feature sizes on the order of 120 nm and smaller. However, CVD may not be extendable to high aspect ratio features at these dimensions. Pulsed layer deposition (PLD) has been seen as a likely replacement for film deposition and holes below 120 nm in width and for the high aspect ratio features.

PLD is useful for depositing thin films having two components. The process generally consists of four steps, which may be repeated to produce films of desired thickness. The steps are normally conducted in a reactor with a controlled environment. The first step consists of saturating a surface with the first precursor or reactant needed to create the film, followed by removing the excess byproducts of the first reaction and any unreacted precursor from the reactor. The next step consists of saturating the surface with a second precursor or reactant in order to form the desired film. The last step is to remove unwanted excess byproducts from the third step and any unreacted precursor.

The precursor exposure steps of PLD are said to be self-limiting, that is, the amount of material deposited on the surface stops depositing after a relatively short period of time. However, in order for the deposition reactions of steps one and three to go to completion, the surface must receive a high exposure of the precursor. This is achieved if the precursor is allowed to remain for a long period above the surface or if the concentration of the precursor above the wafer is high. Provided the precursor exposures are high and the purging performed during the second and third steps are sufficient, there results a thin film consisting of the reaction product of the two components. The purging steps are sufficient if concentrations of the un-reacted precursors and reaction byproducts are low enough to minimize or eliminate one precursor or its byproducts from contacting, and possibly reacting with, the second precursor or its byproducts.

In addition to the steps outlined above, there are additional practical requirements. First, each step should be as short as possible to fulfill the requirement that the thin film be formed as fast as possible to make the entire process commercially viable for ultra large scale integration (ULSI) of the circuits. Second, the smallest possible amount of precursor should be used because precursor costs must be minimized to make the process commercially viable, and un-reacted precursor and byproducts must be minimized to reduce the need for abatement of environmentally harmful substances. Accordingly, the requirements for a rapid process and use of minimum amount of precursor, coupled with the requirements of high exposure and sufficient purging, necessitate trade offs to be made in the PLD process.

SUMMARY OF INVENTION

Bearing in mind the problems and deficiencies of the prior art, it is therefore an object of the present invention to provide a method and apparatus for depositing films in a pulsed layer deposition process.

It is another object of the present invention to provide a method and apparatus for controlling exposure of precursors or reactants to a substrate during a pulsed layer deposition process.

A further object of the present invention is to provide a method and apparatus which reduces the amount of precursor or reactant needed to deposit a film in a pulsed layer deposition process.

It is yet another object of the present invention to provide a method and apparatus that reduces the amount of excess byproduct and unreacted precursor or reactant in a pulsed layer deposition process.

Still other objects and advantages of the invention will in part be obvious and will in part be apparent from the specification.

The above and other objects, which will be apparent to those skilled in art, are achieved in the present invention which is directed to a method of depositing material on a substrate comprising providing a reactor with a reaction chamber having a first volume, and contacting a surface of a substrate in the reaction chamber with a first precursor at the first chamber volume to react with and deposit a first layer on the substrate. The method further includes enlarging the reaction chamber to a second, larger volume and removing undeposited first precursor and any excess reaction product to end reaction of the first precursor with the substrate.

The method may further include reducing the reaction chamber to the first chamber volume, and contacting the first layer in the reaction chamber with a second precursor at the first chamber volume to react with and deposit a second layer on the first layer, thereby forming a film. The method then includes enlarging the reaction chamber to the second volume and removing undeposited second precursor and any excess reaction product to end reaction of the second precursor.

The removal of undeposited first precursor and any excess reaction product may be by purging the reaction chamber at the second volume with a gas, and/or by exposing the reaction chamber at the second volume to a vacuum.

The reaction chamber preferably includes a pedestal adapted to secure the substrate during the deposition and which is movable between first and second positions. A first chamber section is above the pedestal in the first position and defines the first chamber volume. A second chamber section is outside the first chamber section. The reaction chamber is enlarged to the second, larger volume by moving the pedestal to the second position such that the first and second chamber sections together with the pedestal in the second position define the second chamber volume.

In another aspect, the present invention is directed to an apparatus for depositing a film on a substrate comprising a reactor having a variable volume reaction chamber for reacting one or more precursors with the substrate to deposit a film thereon, and a pedestal in the reaction chamber adapted to secure the substrate during the deposition. The pedestal is movable between first and second positions, so that a first chamber section is above the pedestal in the first position, and a second chamber section is outside the first chamber section.

Volume of the reaction chamber may be varied by moving the pedestal between the first position, where the first chamber section together with the pedestal in the first position define a first chamber volume, and the second position, where the first and second chamber sections together with the pedestal in the second position define a second, larger chamber volume.

The pedestal is preferably movable upwards to the first position and downwards to the second position. The second chamber section may be on one or more sides of the pedestal, or below the pedestal. The apparatus may further include a perforated plate, above the pedestal in the first chamber section, which is adapted to diffuse the precursors. It may also include an environmental control for maintaining the first chamber section at a different temperature than the second chamber section.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1-4 of the drawings in which like numerals refer to like features of the invention.

The invention is a reactor apparatus and method for pulsed layer deposition of thin films that meets the requirements of high exposure of precursor and sufficient purging while maintaining low precursor usage and fast process time. The reactor consists of an isolated chamber with a pedestal for holding a wafer, a feed through for uniformly introducing precursor and purging fluid over the wafer surface, and a drain or vacuum source to permit the precursor, byproducts and purging fluids egress. The reactor has two zones, a small volume zone, and a large volume zone. The pedestal and wafer is placed in the small volume zone during precursor exposure, and then moved to the high volume zone, maintained at a lower pressure, to allow un-reacted precursor and byproduct an exit. Concurrently with moving the pedestal to the purge position, or immediately following, the purge fluid is turned on so un-reacted precursor and byproducts are both drawn out by the vacuum source and pushed out by the purge fluid.

Figure 1:
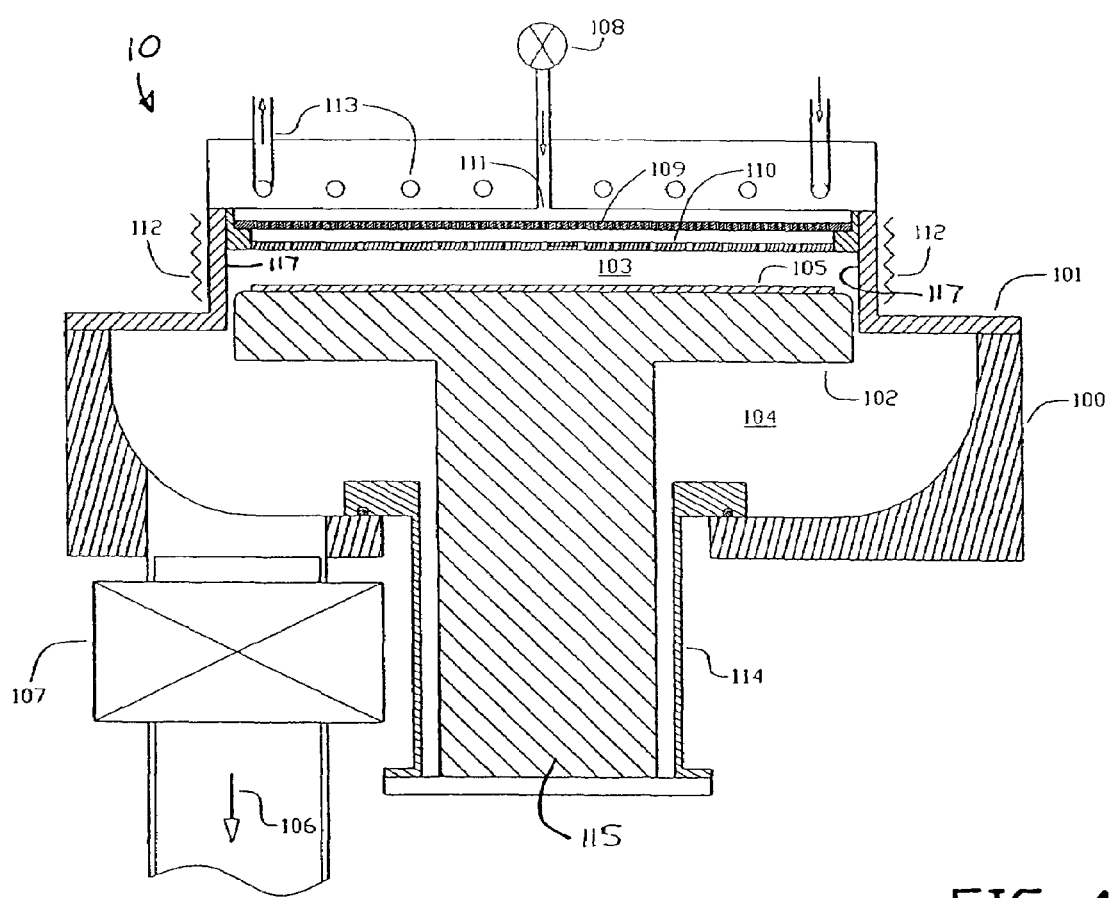
FIG. 1 is a cross-sectional elevational view of the preferred reactor apparatus of the present invention, with the pedestal in the raised position providing a smaller reaction chamber volume.
Figure 2:
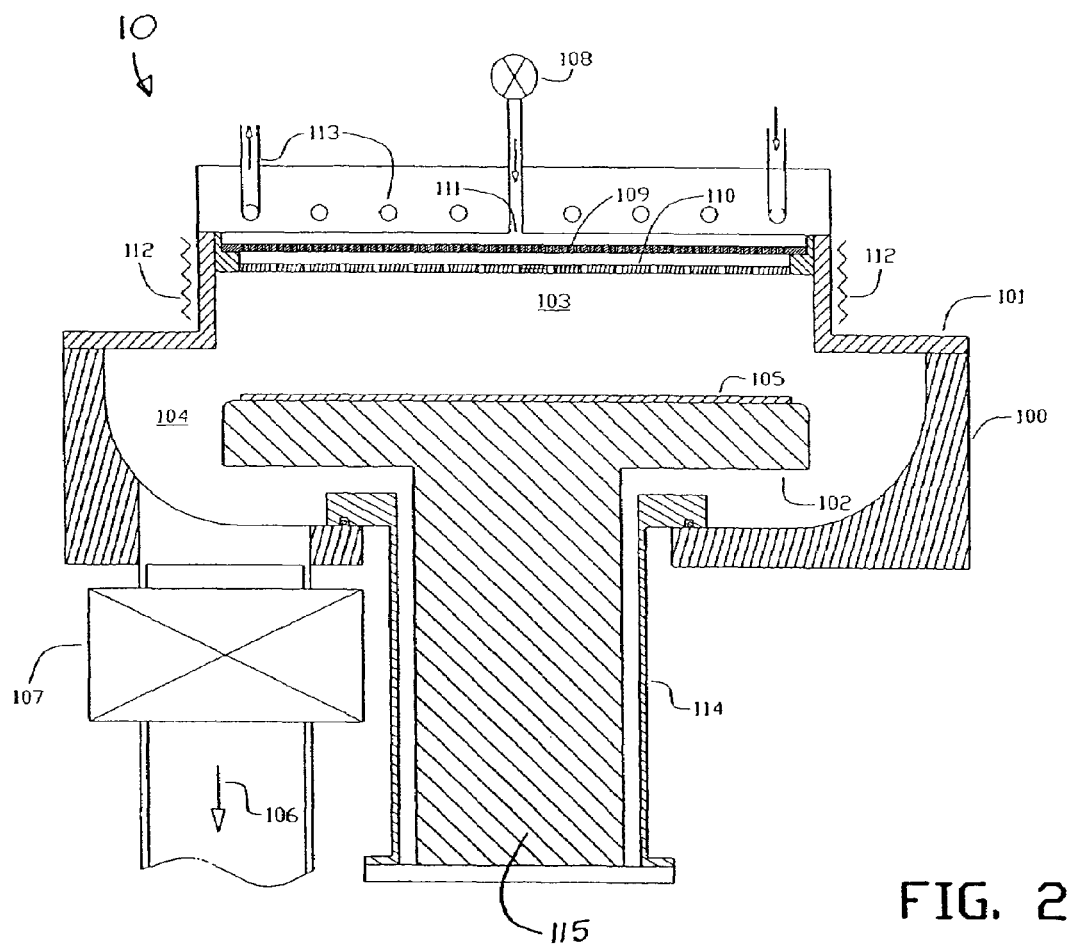
FIG. 2 is a cross-sectional elevational view of the preferred reactor apparatus of FIG. 1, showing the pedestal in the lowered position providing a larger purging reactor chamber volume.

The preferred reactor apparatus for practicing the present is depicted in FIGS. 1 and 2. Reactor 10 comprises a reaction chamber housing 100 having internal reactor chamber sections 103, 104. The reactor chamber interior, particularly chamber section 104, communicates with a passageway 106 leading to a high vacuum source (not shown), with a shut off valve 107 controlling communication therewith. Process fluids enter from a source (not shown) through control valve 108 and passageway 111 into reaction chamber 103. This source may hold solid, liquid or gaseous compounds, which are then processed by conventional means to provide the precursor in gaseous form through passageway 111. Perforated diffusion plates 109 and 110 extend across the upper portions of chamber section 103 below passageway 111, and have different size openings therein in order to diffuse the flow of process fluids evenly into the reaction chamber.

Below reactor chamber section 103 is disposed a moveable circular pedestal 102 for securing a wafer substrate 105 on which the film is to be deposited. Pedestal 102 is moveable between an upper position as shown in FIG. 1, and a lower position as shown in FIG. 2. A columnar pedestal base 115, on which the pedestal 102 is secured, is slideable in conjunction with a flexible, pleated metal housing section 114 to move between the two positions, while maintaining a sealed environment within the reaction chamber.

In the upper position (FIG. 1), an initial, relatively small reactor chamber volume is defined by the upper and side walls 117 of chamber section 103 and the surface of pedestal 102. In this embodiment, pedestal 102 is of a diameter that is slightly smaller than the spacing between opposite reactor side walls 117, so that the pedestal may move upward to a position above the lower portion of walls 117. Reactor chamber section 104 is located below and on at least one side of, preferably completely around, pedestal 102. When the pedestal is moved down to its lowered position (FIG. 2), a subsequent larger reactor chamber volume is defined by the combined volume of both chamber sections 103 and 104, as well as pedestal 102. Pedestal 102 may also be moveable to secure wafer 105 in any intermediate position between the upper and lower positions depicted.

In order to control the temperature of reactor chamber section 103 at a temperature different from the remainder of the reactor chamber, there are provided heating elements 112 along side the sidewalls of chamber section 103, and cooling coils 113 containing a re-circulating fluid in the overhead wall of chamber section 103. These electric heaters 112 and cooling coil 113 provide environmental controls for heating or cooling the wafer while in the smaller reactor chamber volume.

Figure 3:
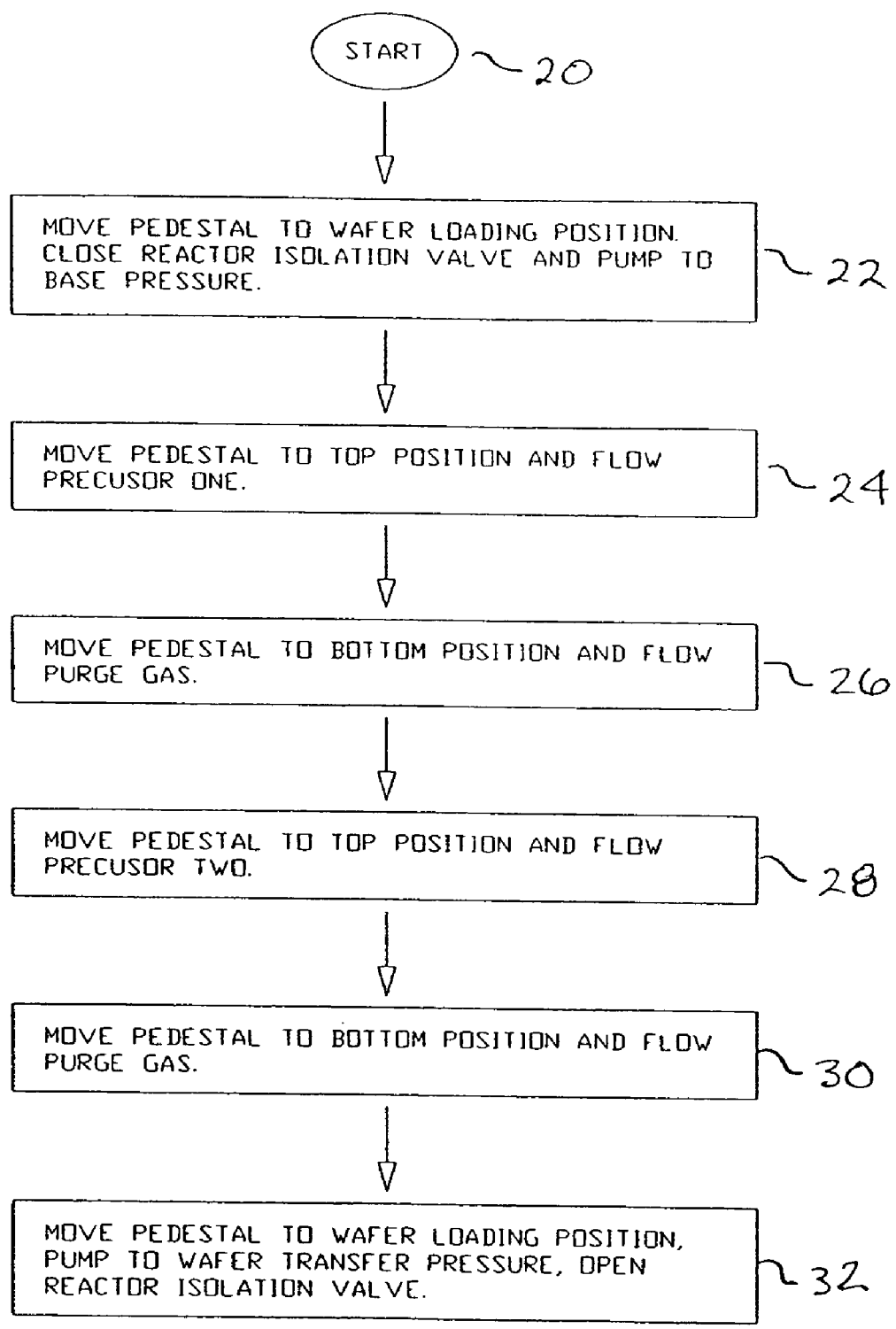
FIG. 3 is a flow chart showing the preferred method of practicing the process of the present invention.

Operation of the apparatus is depicted in the process steps as shown in FIG. 3. At the start of the process 20, the pedestal is moved to the desired wafer loading position, and the wafer secured to the top of pedestal 102. The reactor is then pressurized to its base pressure, 22. The pedestal is then moved upward to the reactor top, compacted position, 24, and the first precursor or reactant is flowed into chamber section 103 through valve 108 and passageway 111. The temperature in reactor vessel 103 is also adjusted by environmental controls 112, 113. While in the smaller chamber volume, the wafer surface 105 receives a high exposure of the first precursor. Because of the limited volume, smaller amounts of gaseous precursor may achieve higher desired concentration for reaction. Once the desired reaction is achieved along a layer of the wafer surface, the pedestal is moved to the bottom, expanded position 26, and the chambers are evacuated through valve 107 and simultaneously purged with a reaction-limiting purge gas through valve 108. The higher volume within combined reaction chamber sections 103 and 104 rapidly reduces the overpressure and concentration of the first precursor, and limits the reaction on the wafer surface. Once the initial precursor and excess byproducts are removed from the reaction chamber above the wafer substrate 105, the pedestal is again moved to the top position, 28, and the second precursor is flowed into the smaller initial chamber volume 103 as described in step 24. Again, once the reaction with the second precursor is achieved, and a desired film thickness is deposited on wafer 105 surface, the pedestal is moved to the bottom position, 30, and vacuum and purge gas flow is again initiated in order to stop the reaction and remove excess second precursor and unwanted reaction byproducts from the larger volume reaction chamber.

Process steps 24-30 may be repeated as necessary to achieve the desired thickness of the deposited layer on the surface of wafer substrate 105. Once the film deposition is completed, the pedestal is moved back to the desired wafer loading position, 32, and the reaction chamber is pumped to the wafer transfer pressure. A reactor isolation valve (not shown) is then opened and the wafer may be removed from the reaction chamber.

An example of pulse layer deposition utilizing the method and apparatus of the present invention is described below.

With the reactor in the compacted position, trimethyl aluminum at a pressure of 12 torr is introduced into the chamber by opening valve 108 for approximately 1 sec, to deposit an approximately monoatomic layer of aluminum oxide on to the wafer surface. The wafer pedestal is then lowered to the reactor expanded position, and an inert purge gas such as nitrogen is introduced at a high rate by opening valve 108 to purge the remaining precursor and reactant gases over the wafer. Simultaneously, valve 107 is opened to evacuate the expanded chamber. Subsequently, the pedestal is moved up, to the reactor compacted position, and a silanol precursor, such as tris-t-pentoxysilanol, is introduced into the chamber by opening valve 108. The silanol gas is at a pressure of about 1 Torr and the valve is opened for about 5 to 20 seconds, until the polymerization reaction at the wafer surface results in a silicon dioxide layer of about 100-150 angstroms thickness. The aluminum oxide layer serves to catalyze the reaction that deposits the silicon dioxide. The pedestal is then lowered to expand the reaction chamber, and the purge gas is again introduced to stop the reaction and evacuate the chamber.

Figure 4:
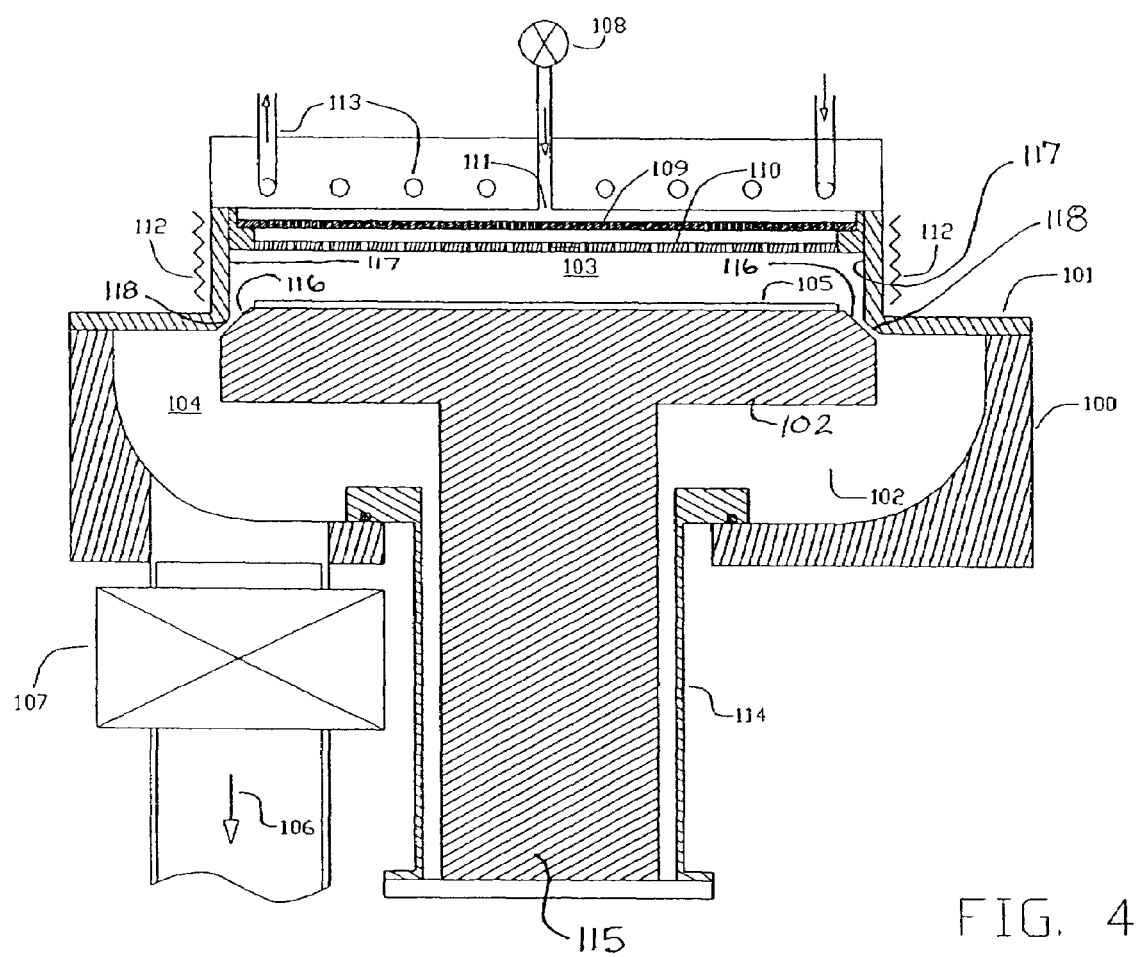
FIG. 4 is a cross-sectional elevational view of an alternate embodiment of the reactor apparatus of FIG. 1, with the pedestal in the raised position.

FIG. 4 depicts an alternate embodiment of the reactor apparatus of FIG. 1, with the pedestal in the raised position. In this embodiment, pedestal 102 has a diameter larger than the spacing between side walls 117. Pedestal 102 has chamfered edges 116 that correspond with the lower chamfered corners 118 of reactor walls 117. If film builds up on the reactor walls, the space between the pedestal and walls as in FIG. 1 will not become sealed, and the pedestal will not bind to the walls, even if the pedestal contacts chamfered corners 118.

Accordingly, the present invention provides an improved method and apparatus for a pulsed layer deposition in the fabrication of microelectronic circuits. The variable reactor chamber volume makes the process partially viable for ULSI processing. Additionally, the variable reaction chamber volume reduces the amount of precursors used while enabling high concentrations and fast reaction times to be achieved.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as failing within the true scope and spirit of the present invention.

Thus, having described the invention, what is claimed is:

1. A method of depositing material on a substrate comprising:

providing a reactor with a reaction chamber having a first volume;

securing a substrate within the reaction chamber;

introducing a first precursor into the reaction chamber at the first chamber volume;

contacting a surface of the substrate in the reaction chamber with the first precursor at the first chamber volume to cause a reaction of the first precursor with and deposit a first layer on the substrate; and enlarging the reaction chamber to a second, larger volume to reduce concentration of the first precursor and removing undeposited first precursor to end reaction of the first precursor.

2. The method of claim 1 further including:

reducing the reaction chamber to the first chamber volume;

introducing a second precursor into the reaction chamber at the first chamber volume;

contacting the first layer in the reaction chamber with the second precursor at the first chamber volume to cause a reaction of the second precursor with and deposit a second layer on the first layer, thereby forming a film; and enlarging the reaction chamber to the second volume to reduce concentration of the second precursor and removing undeposited second precursor to end reaction of the second precursor.

3. The method of claim 2 further including providing a perforated plate above the pedestal in the reactor chamber, and diffusing the first and second precursors through the perforated plate into the reaction chamber.

4. The method of claim 2 wherein the second layer is a different composition than the second precursor.

5. The method of claim 1 wherein removing undeposited first precursor is by purging the reaction chamber at the second volume with a gas.

6. The method of claim 1 wherein removing undeposited first precursor is by exposing the reaction chamber at the second volume to a vacuum.

7. The method of claim 1 wherein the reaction chamber includes a pedestal adapted to secure the substrate during the deposition and movable within the chamber betweens an upper position and a lower position, the reaction chamber having the first volume when the pedestal is in the upper position and the second, larger volume when the pedestal is in the lower position, a first chamber section above the pedestal in the upper position defining the first chamber volume, and a second chamber section outside the first chamber section; and wherein the reaction chamber is enlarged to the second, larger volume by moving the pedestal to the lower position such that the first and second chamber sections together with the pedestal in the lower position define the second chamber volume.

8. The method of claim 7 wherein the first layer is a different composition than the first precursor.

9. The method of claim 7 wherein the first chamber section above the pedestal has spaced side walls and chamfered corners on lower ends of the side walls, wherein the pedestal has a diameter greater than the spacing between the first chamber section side walls, and wherein the pedestal has chamfered edges that correspond with the chamfered corners on the lower ends of the first chamber section side walls.

10. The method of claim 1 wherein the second chamber volume is on one or more sides of the pedestal.

11. The method of claim 1 wherein the second chamber volume is below the pedestal.

12. The method of claim 1 wherein the second chamber volume is on the side of and below the pedestal.

13. The method of claim 1 further including providing a perforated plate above the pedestal in the reactor chamber, and diffusing the first precursor through the perforated plate into the reaction chamber.

14. The method of claim 1 wherein the first layer is a different composition than the first precursor.

15. A method of depositing a film on a substrate comprising:

providing a reactor with a reaction chamber, the reaction chamber including a pedestal adapted to secure a substrate during the deposition and movable within the chamber between an upper position and a lower position, the reaction chamber having a first volume when the pedestal is in the upper position and a second, larger volume when the pedestal is in the lower position;

securing a substrate on the pedestal;

introducing a first precursor into the reaction chamber when the substrate is on the pedestal is in the upper position at the first chamber volume;

contacting a surface of the substrate in the reaction chamber with the first precursor at the first chamber volume to cause a reaction of the first precursor with and deposit a first layer on the substrate;

lowering the pedestal to the lower position to enlarge the reaction chamber to the second, larger volume to reduce concentration of the first precursor and removing undeposited first precursor to end reaction of the first precursor;

raising the pedestal to the upper position to reduce the reaction chamber to the first chamber volume;

introducing a second precursor into the reaction chamber when the substrate is on the pedestal is in the upper position at the first chamber volume;

contacting the first layer in the reaction chamber with the second precursor at the first chamber volume to cause a reaction of the second precursor with and deposit a second layer on the first layer, thereby forming a film; and lowering the pedestal to the lower position to enlarge the reaction chamber to the second volume to reduce concentration of the second precursor and removing undeposited second precursor to end reaction of the second precursor.

16. The method of claim 15 wherein the reaction chamber includes a first chamber section above the pedestal in the upper position defining the first chamber volume, and a second chamber section outside the first chamber section; and wherein the reaction chamber is enlarged to the second, larger volume by moving the pedestal to the lower position such that the first and second chamber sections together with the pedestal in the second position define the second chamber volume.

17. The method of claim 16 wherein the first chamber section above the pedestal has spaced side walls and chamfered corners on lower ends of the side walls, wherein the pedestal has a diameter greater than the spacing between the first chamber section side walls, and wherein the pedestal has chamfered edges that correspond with the chamfered corners on the lower ends of the first chamber section side walls.

18. The method of claim 15 further including providing a perforated plate above the pedestal in the reactor chamber, and diffusing the first and second precursors through the perforated plate into the reaction chamber.

19. The method of claim 15 wherein the first layer is a different composition than the first precursor, and the second layer is a different composition than the second precursor.

* * * * *